(12) United States Patent
Asano

(10) Patent No.: US 7,727,791 B2
(45) Date of Patent: Jun. 1, 2010

(54) SEMICONDUCTOR LAYER, PROCESS FOR FORMING THE SAME, AND SEMICONDUCTOR LIGHT EMITTING DEVICE

(75) Inventor: Hideki Asano, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 355 days.

(21) Appl. No.: 11/730,459

(22) Filed: Apr. 2, 2007

(65) Prior Publication Data

US 2007/0228394 A1  Oct. 4, 2007

(30) Foreign Application Priority Data

Mar. 31, 2006 (JP) ............................. 2006-096879
Feb. 22, 2007 (JP) ............................. 2007-042239

(51) Int. Cl.
*H01L 21/00* (2006.01)
*C23C 16/00* (2006.01)

(52) U.S. Cl. ............... 438/46; 438/796; 118/723 R; 257/E21.331

(58) Field of Classification Search ............. 438/46, 438/796; 118/723 R; 257/E21.331
See application file for complete search history.

(56) References Cited

U.S. PATENT DOCUMENTS

| 4,885,260 A | * | 12/1989 | Ban et al. ............ 117/92 |
| 6,558,995 B1 | * | 5/2003 | Gilliland et al. ............ 438/181 |
| 7,033,439 B2 | * | 4/2006 | Shibata et al. ............ 117/200 |
| 7,635,872 B2 | * | 12/2009 | Asano ............ 257/87 |
| 2006/0021564 A1 | * | 2/2006 | Norman et al. ............ 117/84 |
| 2008/0132081 A1 | * | 6/2008 | Shaheen et al. ............ 438/759 |

FOREIGN PATENT DOCUMENTS

JP  64-17484 A  1/1989

OTHER PUBLICATIONS

Ryuzo Ega et al., "Ar Ion Laser-Assisted Metalorganic Molecular Beam Epitaxy of InGaAs", Japanese Journal of Applied Physics, vol. 30, No. 1A, Jan. 1991, pp. L4-L6.*

* cited by examiner

*Primary Examiner*—W. David Coleman
(74) *Attorney, Agent, or Firm*—Sughrue Mion, PLLC

(57) ABSTRACT

A semiconductor layer contains, as a principal constituent, a Group III-V semiconductor compound, which may be represented by the general formula: $Al_xGa_yIn_zN$, wherein x represents a number satisfying the condition $0 \leq x < 1$, y represents a number satisfying the condition $0 < y < 1$, and z represents a number satisfying the condition $0 < z < 1$, with the proviso that $x+y+z=1$. The semiconductor layer is formed with a laser assisted metalorganic vapor phase epitaxy technique. A semiconductor light emitting device comprises the semiconductor layer and may be constituted as a semiconductor laser or a light emitting diode.

3 Claims, 4 Drawing Sheets

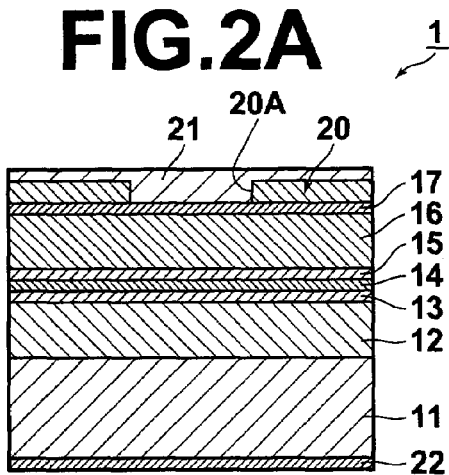
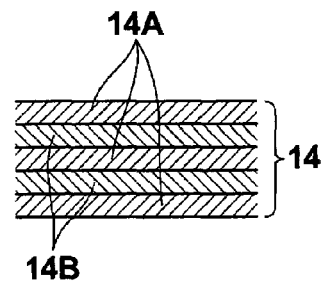
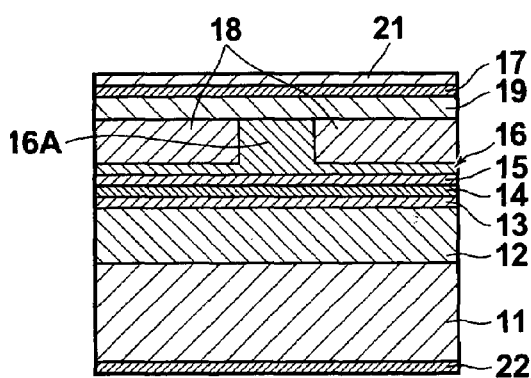
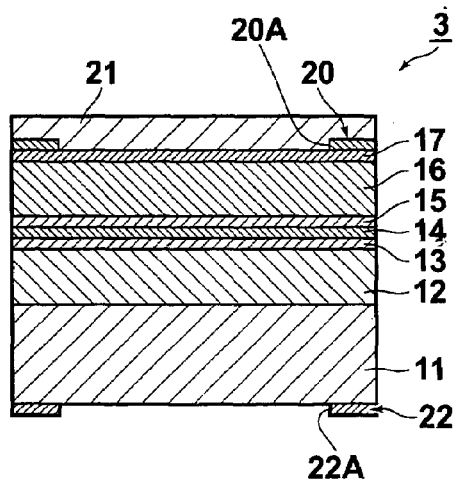
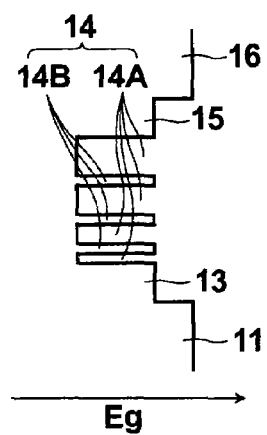

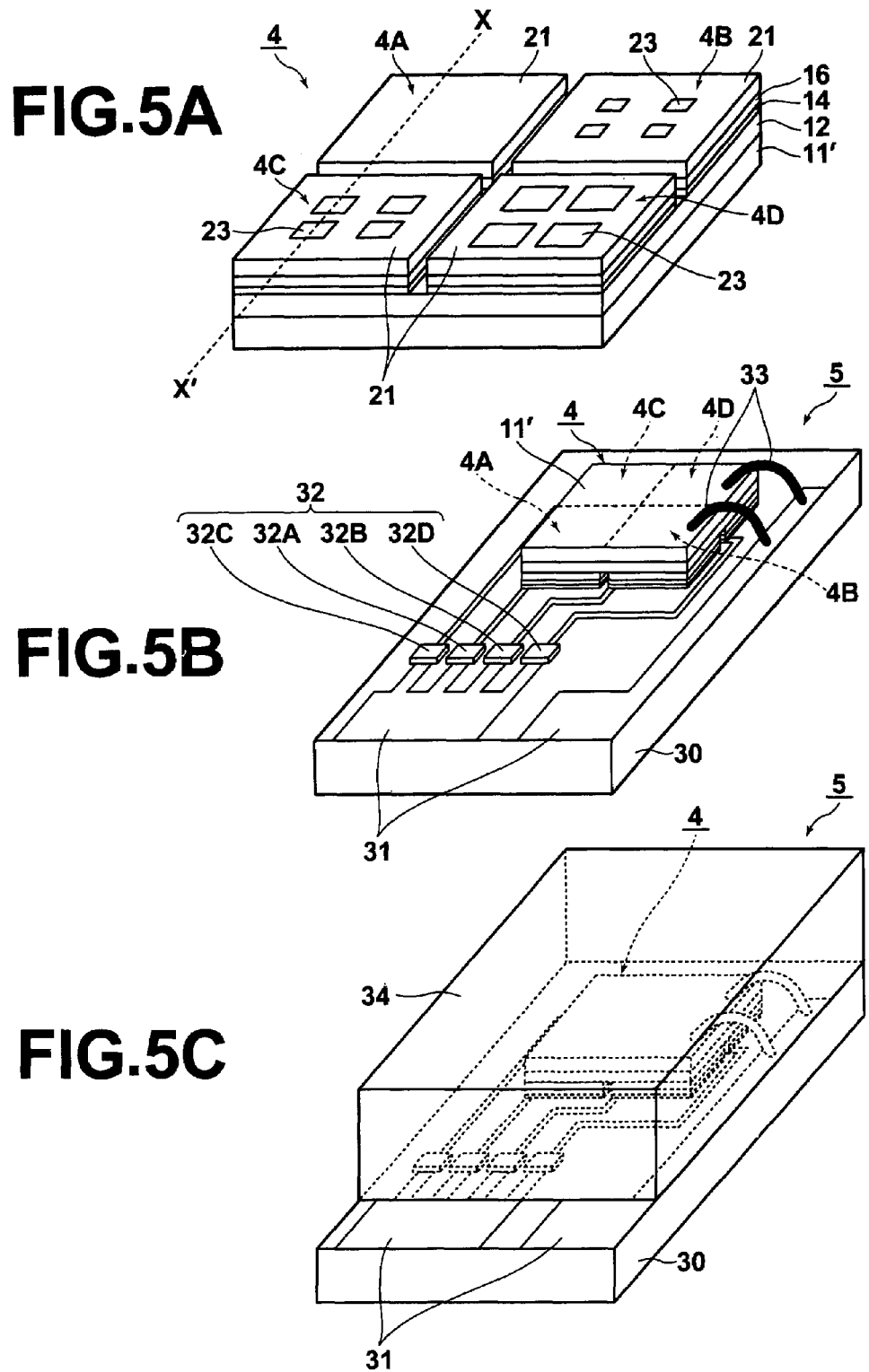

SEMICONDUCTOR LAYER, PROCESS FOR FORMING THE SAME, AND SEMICONDUCTOR LIGHT EMITTING DEVICE

BACKGROUND OF THE INVENTION

1. Field of the Invention

This invention relates to a semiconductor layer containing, as a principal constituent, a Groups III-V semiconductor compound, which may be represented by the general formula $Al_xGa_yIn_zN$, wherein x represents a number satisfying the condition $0 \leq x < 1$, y represents a number satisfying the condition $0 < y < 1$, and z represents a number satisfying the condition $0 < z < 1$, with the proviso that $x+y+z=1$. This invention also relates to a process for forming the semiconductor layer. This invention further relates to a semiconductor light emitting device, which comprises the semiconductor layer, and a semiconductor light emitting apparatus, which comprises the semiconductor light emitting device.

2. Description of the Related Art

In the field of light emitting diodes, GaN type materials have been developed, and high-efficiency blue to green light emitting diodes have been used in practice. The light emitting diodes for the three primary colors of red, green, and blue have thus become available, and application of the light emitting diodes to displaying use applications, and the like, has come into existence.

Also, recently, a white light emitting diode has been used in practice. The white light emitting diode comprises a blue light emitting diode and fluorescent substances located around the blue light emitting diode, which fluorescent substances are capable of being excited by the light having been produced by the blue light emitting diode and are thus capable of producing light having wavelengths falling within wavelength regions different from the blue wavelength region. With the white light emitting diode, the light having been produced by the blue light emitting diode and the light having been produced by the fluorescent substances are combined together, and white light is thereby obtained.

In the field of semiconductor lasers, semiconductor lasers capable of producing laser beams having wavelengths falling within the range of 375 nm (of the near ultraviolet light wavelength region) to 450 nm (of the blue light wavelength region) have been used in practice. However, under existing circumstances, there is no prospect of use of semiconductor lasers, which are capable of producing laser beams having longer wavelengths falling within the green to yellow light wavelength region, in practice.

An AlGaInN type semiconductor laser utilizing a ZnO base plate as a base plate has been proposed in, for example, Japanese Unexamined Patent Publication No. 1(1989)-017484. One of causes for the limitation of the possible wavelengths of the laser beams, which are produced by the currently used semiconductor lasers, to the blue light wavelength region of 450 nm is the use of the GaN base plate as the base plate. It is considered that, in cases where a ZnO base plate having a lattice constant larger than the lattice constant of the GaN base plate is used, the band gap energy of the AlGaInN type material, which is lattice matched with the ZnO base plate, is capable of being set to be small, and that a semiconductor laser producing a laser beam having a longer wavelength is thus capable of being obtained.

However, with the AlGaInN type semiconductor laser utilizing the ZnO base plate as the base plate as proposed in, for example, Japanese Unexamined Patent Publication No. 1(1989)-017484, the problems with regard to production are encountered. Specifically, in cases where the AlGaInN material is caused to grow on the ZnO base plate by use of a metalorganic vapor phase epitaxy technique (hereinbelow referred to as the MOVPE technique), which has widely been used for the production of the semiconductor lasers, the oxygen atom of ZnO of the base plate is eliminated, the base plate itself deteriorates before the crystal grows, and a crystal having good quality is not capable of being caused to grow. Also, with the semiconductor laser as proposed in, for example, Japanese Unexamined Patent Publication No. 1(1989)-017484, the semiconductor active layer has a bulk structure. The semiconductor laser as proposed in, for example, Japanese Unexamined Patent Publication No. 1(1989)-017484 thus has a device structure such that high efficiency characteristics are not always capable of being obtained.

As described above, the semiconductor laser as proposed in, for example, Japanese Unexamined Patent Publication No. 1(1989)-017484 has the production problems with regard to the deterioration of the base plate and the low crystalline characteristics of the AlGaInN material and the problems with regard to the device structure in which the semiconductor active layer has the bulk structure. Therefore, with the semiconductor laser as proposed in, for example, Japanese Unexamined Patent Publication No. 1(1989)-017484, it is not always possible to obtain a semiconductor laser having a high efficiency and good light emission characteristics. Also, in the examples described in, for example, Japanese Unexamined Patent Publication No. 1(1989)-017484, only the production of blue to violet laser beams is described. Thus in, for example, Japanese Unexamined Patent Publication No. 1(1989)-017484, nothing is reported with respect to the production of a laser beam having a long wavelength falling within the green light wavelength region or a longer wavelength region.

Further, with the conventional light emitting diodes, the light emitting diodes alone are not capable directly producing the white light. Specifically, heretofore, the fluorescent substances are excited by the blue light emitting diode, the light having been produced by the blue light emitting diode and the light having been produced by the fluorescent substances are combined together, and the white light is thus indirectly obtained. In cases where the light emission efficiency is taken into consideration, it is desired that a white light emitting diode capable of directly producing the white light is capable of being obtained.

SUMMARY OF THE INVENTION

The primary object of the present invention is to provide a film forming process, with which an AlGaInN layer or a GaInN layer is caused to grow on a base plate, such as a ZnO base plate, such that deterioration of the base plate may be suppressed, and such that the formed layer may have good crystalline characteristics.

Another object of the present invention is to provide a semiconductor layer having been formed with the film forming process.

A further object of the present invention is to provide a semiconductor light emitting device, which has a high efficiency and good light emission characteristics, by use of the film forming technique.

A still further object of the present invention is to provide a semiconductor laser capable of producing a laser beam having a wavelength falling within a green to yellow light wavelength region.

The specific object of the present invention is to provide a white light emitting diode, which has a high efficiency and is capable of directly producing white light.

The present invention provides a semiconductor layer, containing, as a principal constituent, a Groups III-V semiconductor compound, which may be represented by the general formula:

$$Al_xGa_yIn_zN$$

wherein x represents a number satisfying the condition $0 \leq x < 1$, y represents a number satisfying the condition $0 < y < 1$, and z represents a number satisfying the condition $0 < z < 1$, with the proviso that $x+y+z=1$, the semiconductor layer having been formed with a laser assisted metalorganic vapor phase epitaxy technique (i.e., a laser assisted MOVPE technique).

With the laser assisted MOVPE technique, while a laser beam is being irradiated to a base plate, at least one kind of a film formation raw material, which contains a metalorganic compound, is supplied in a vapor phase onto the base plate. At least a part of the film formation raw material is thus decomposed, and a film containing the constituent element of the film formation raw material is caused to grow in the vapor phase on the base plate.

The term "principal constituent" as used herein means the constituent contained in a proportion of at least 99 mol %.

The semiconductor layer in accordance with the present invention may be modified such that metalorganic compounds are used as the Group-III raw materials, and ammonia is used as the Group-V raw material. Also, the semiconductor layer in accordance with the present invention may be modified such that the semiconductor layer is formed on a ZnO base plate. Further, the semiconductor layer in accordance with the present invention may be modified such that the semiconductor layer is formed at a film formation temperature of at most 800° C.

The present invention also provides a process for forming a semiconductor layer, comprising the steps of:
forming a semiconductor layer on a base plate by use of a laser assisted metalorganic vapor phase epitaxy technique, the semiconductor layer containing, as a principal constituent, a Groups III-V semiconductor compound, which may be represented by the general formula:

$$Al_xGa_yIn_zN$$

wherein x represents a number satisfying the condition $0 \leq x < 1$, y represents a number satisfying the condition $0 < y < 1$, and z represents a number satisfying the condition $0 < z < 1$, with the proviso that $x+y+z=1$.

The process for forming a semiconductor layer in accordance with the present invention should preferably be modified such that a laser beam is irradiated to the base plate from at least one direction, such that the laser beam passes just above the base plate and in a direction approximately parallel with a base plate surface of the base plate, supply of film formation raw materials with respect to the base plate is performed, while the laser beam is being thus irradiated to the base plate, and the semiconductor layer is thereby formed.

The term "direction approximately parallel with a base plate surface" as used herein means the direction of irradiation of the laser beam, which direction makes an angle falling within the range of 90±2 degrees with respect to the direction normal to the base plate surface of the base plate.

In such cases, the process for forming a semiconductor layer in accordance with the present invention should more preferably be modified such that the irradiation of the laser beam to the base plate is performed with a laser beam profile, such that a distribution of a laser beam intensity, which distribution is taken in the direction parallel with the base plate surface, is approximately uniform, and such that the distribution of the laser beam intensity, which distribution is taken in the direction normal to the base plate surface, is the distribution approximately represented by the Gaussian distribution, and the laser beam is irradiated to the base plate, such that a peak of the distribution of the laser beam intensity, which distribution is taken in the direction normal to the base plate surface, is present within the range of at most 2 mm from the base plate surface, which range is taken in the direction normal to the base plate surface.

The present invention further provides a first semiconductor light emitting device, comprising the semiconductor layer in accordance with the present invention.

The present invention still further provides a second semiconductor light emitting device, comprising:
i) a first electrical conduction type semiconductor base plate,
ii) a first electrical conduction type electrode,
iii) a first electrical conduction type cladding layer,
iv) a semiconductor active layer,
v) a second electrical conduction type cladding layer, and
vi) a second electrical conduction type electrode,
the first electrical conduction type semiconductor base plate being a ZnO base plate,
each of the first electrical conduction type cladding layer and the second electrical conduction type cladding layer being an AlGaInN layer,
the semiconductor active layer being a multiple quantum well active layer, which is constituted of a laminate structure comprising GaInN quantum well layers and at least one barrier layer selected from the group consisting of a GaInN barrier layer and an AlGaInN barrier layer,
each of the first electrical conduction type cladding layer, the semiconductor active layer, and the second electrical conduction type cladding layer being formed by use of a laser assisted metalorganic vapor phase epitaxy technique.

The term "first electrical conduction type" as used herein means either one of a p-type and an n-type, and the term "second electrical conduction type" as used herein means the other type. Thus the term "first electrical conduction type" and the term "second electrical conduction type" as used herein means the different electrical conduction types.

The second semiconductor light emitting device in accordance with the present invention may be constituted such that the first electrical conduction type electrode and the second electrical conduction type electrode are formed on different surfaces of the semiconductor base plate. Alternatively, the second semiconductor light emitting device in accordance with the present invention may be constituted such that the first electrical conduction type electrode and the second electrical conduction type electrode are formed on an identical surface of the semiconductor base plate. Also, as the first electrical conduction type semiconductor base plate, an electrically conductive ZnO base plate may be used. In such cases, the electrically conductive ZnO base plate may act also as the first electrical conduction type electrode.

The second semiconductor light emitting device in accordance with the present invention should preferably be modified such that the first electrical conduction type semiconductor base plate is a ZnO (0001) base plate, and the first electrical conduction type cladding layer and the second electrical conduction type cladding layer are approximately lattice matched with the first electrical conduction type semiconductor base plate.

Also, in such cases, the second semiconductor light emitting device in accordance with the present invention should more preferably be modified such that a lattice constant of each of the GaInN quantum well layers constituting the semiconductor active layer is larger than the lattice constant of the first electrical conduction type semiconductor base plate, and the at least one barrier layer constituting the semiconductor active layer, which barrier layer is selected from the group consisting of the GaInN barrier layer and the AlGaInN barrier layer, is approximately lattice matched with the first electrical conduction type semiconductor base plate.

The term "approximate lattice matching" as used herein means that the two layers satisfy the condition of $(a1-a2)/a1 < 3\%$, wherein $a1$ represents the lattice constant of one of the two layers, and $a2$ represents the lattice constant of the other layer.

In accordance with the present invention, it is possible to furnish a semiconductor laser, which has the device constitution of the second semiconductor light emitting device in accordance with the present invention, and which is capable of producing a laser beam having a wavelength falling within the range of 480 nm to 630 nm (the green to red light wavelength region).

Also, in accordance with the present invention, it is possible to furnish a light emitting diode, which has the device constitution of the second semiconductor light emitting device in accordance with the present invention, and which has a constitution such that the plurality of the GaInN quantum well layers constituting the semiconductor active layer vary in transition wavelength from one another.

The light emitting diode having the constitution described above should more preferably be modified such that the transition wavelengths of the plurality of the GaInN quantum well layers constituting the semiconductor active layer are set such that the transition wavelength of the GaInN quantum well layer, which is located closest to the first electrical conduction type semiconductor base plate, is the shortest, and the transition wavelengths of the GaInN quantum well layers are set to be long successively as the positions of the GaInN quantum well layers become remote from the base plate.

Also, the light emitting diode having the constitution described above should more preferably be modified such that the plurality of the GaInN quantum well layers constituting the semiconductor active layer have different compositions and/or different thicknesses, and the transition wavelengths of the plurality of the GaInN quantum well layers are thereby varied.

Further, the light emitting diode having the constitution described above should more preferably be modified such that the first electrical conduction type electrode is formed in a pattern provided with an aperture, and light is taken out via the aperture to the exterior.

In accordance with the present invention, it is possible to obtain a light emitting diode, in which white light is directly emitted from the semiconductor active layer.

The term "white light" as used herein means the broad light containing light having wavelengths falling within the blue to red light wavelength range, i.e. the wavelength range of 470 nm to 640 nm.

In accordance with the present invention, it is possible to obtain a light emitting diode, which has the device constitution of the second semiconductor light emitting device in accordance with the present invention, and which has a plurality of light emitting sections varying in center emission wavelength. With the constitution described above, it is possible to obtain a light emitting diode capable of producing the white light.

With the light emitting diode having the constitution described above, at least one characteristic selected from among the area, the thickness, and the composition of the semiconductor active layer may be varied for each of the light emitting sections, and the center emission wavelengths of the plurality of the light emitting sections may thereby be varied.

Furthermore, the light emitting diode having the constitution described above should more preferably be modified such that the first electrical conduction type electrodes of the plurality of the light emitting sections are electrically isolated from one another, and/or the second electrical conduction type electrodes of the plurality of the light emitting sections are electrically isolated from one another.

The present invention also provides a semiconductor light emitting apparatus, comprising:

i) the semiconductor light emitting device in accordance with the present invention, which is constituted as the light emitting diode having the plurality of the light emitting sections having been formed such that the first electrical conduction type electrodes of the plurality of the light emitting sections are electrically isolated from one another, and/or the second electrical conduction type electrodes of the plurality of the light emitting sections are electrically isolated from one another, and ii) a current control section for controlling an electric current flowing across each of the plurality of the light emitting sections of the semiconductor light emitting device, the semiconductor light emitting device and the current control section being integrated on a mounting base plate.

With the constitution in accordance with the present invention, the AlGaInN layer or the GaInN layer is caused to grow on the base plate, such as the ZnO base plate, by use of the laser assisted metalorganic vapor phase epitaxy technique (i.e. the laser assisted MOVPE technique). With the constitution in accordance with the present invention, the AlGaInN layer or the GaInN layer is capable of being caused to grow on the base plate, such as the ZnO base plate, such that the deterioration of the base plate may be suppressed, and such that the formed layer may have good crystalline characteristics. In cases where the film forming technique described above is employed, it is possible to obtain the semiconductor light emitting device, which has a high efficiency and good light emission characteristics.

Also, with the technique in accordance with the present invention, it is possible to obtain the semiconductor laser, which has a high efficiency and is capable of producing the laser beam having the wavelength falling within the green to yellow light wavelength region. With the technique in accordance with the present invention, in the field of the semiconductor lasers, the semiconductor lasers for the three primary colors of red, green, and blue become available. It is expected that the semiconductor lasers are capable of being utilized for full color laser display devices, and the like.

Further, with the technique in accordance with the present invention, it is possible to obtain the white light emitting diode, which has a high efficiency and is capable of directly producing the white light. With the white light emitting diode in accordance with the present invention, a markedly higher light emission efficiency is capable of being obtained, and electric power consumption is capable of being kept markedly lower than with the conventional white light emitting diode, in which the fluorescent substances are excited by the blue light emitting diode, in which the light having been produced by the blue light emitting diode and the light having been produced by the fluorescent substances are combined together, and in which the white light is thus obtained indirectly.

BRIEF DESCRIPTION OF THE DRAWINGS

FIG. 2A is a sectional view showing a semiconductor laser, which acts as a first embodiment of the semiconductor light emitting device in accordance with the present invention, FIG. 2B is an enlarged sectional view showing a semiconductor active layer constituting the semiconductor laser of FIG. 2A, FIG. 3 is a sectional view showing a semiconductor laser, which acts as a second embodiment of the semiconductor light emitting device in accordance with the present invention, FIG. 4A is a sectional view showing a light emitting diode, which acts as a third embodiment of the semiconductor light emitting device in accordance with the present invention, FIG. 4B is a band diagram showing a base plate and principal layers constituting the light emitting diode of FIG. 4A, FIG. 5A is a perspective view showing a light emitting diode, which acts as a fourth embodiment of the semiconductor light emitting device in accordance with the present invention, FIG. 5B is a perspective view showing a semiconductor light emitting apparatus, which is provided with the light emitting diode of FIG. 5A, with a sealing resin being omitted for clearness, FIG. 5C is a perspective view showing the semiconductor light emitting apparatus of FIG. 5B, with the sealing resin being illustrated.

DESCRIPTION OF THE PREFERRED EMBODIMENTS

Figure 1A:
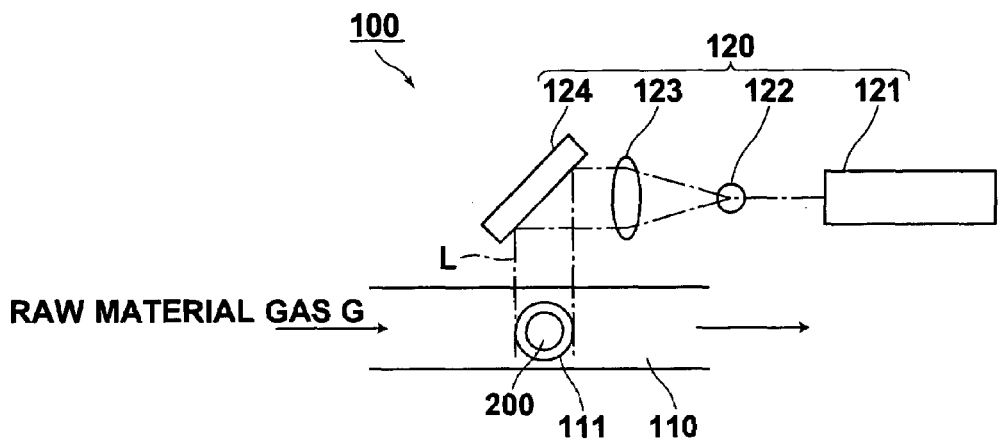
FIG. 1A is a schematic plan view showing a film forming apparatus, which is appropriate for use in film formation of a semiconductor layer in accordance with the present invention.

The present invention will hereinbelow be described in further detail with reference to the accompanying drawings.

[Semiconductor Layer and Film Forming Process]

The semiconductor layer in accordance with the present invention is characterized by containing, as the principal constituent, the Groups III-V semiconductor compound, which may be represented by the general formula:

wherein x represents the number satisfying the condition $0 \leq x < 1$, y represents the number satisfying the condition $0 < y < 1$, and z represents the number satisfying the condition $0 < z < 1$, with the proviso that $x+y+z=1$, the semiconductor layer having been formed with the laser assisted metalorganic vapor phase epitaxy technique (i.e., the laser assisted MOVPE technique).

The semiconductor layer in accordance with the present invention may be a doped semiconductor layer, which has been doped with a p-type dopant or an n-type dopant. Alternatively, the semiconductor layer in accordance with the present invention may be a non-doped semiconductor layer.

The semiconductor layer in accordance with the present invention is capable of being formed on an arbitrary base plate. The semiconductor layer in accordance with the present invention is capable of being formed on a ZnO base plate, which undergoes deterioration in cases where the ordinary MOVPE technique is utilized. The ZnO base plate should preferably be an n-type ZnO (0001) base plate.

The semiconductor layer in accordance with the present invention is capable of being formed with a process, in which the metalorganic compounds are used as the Group-III raw materials, and ammonia is used as the Group-V raw material. In such cases, the Group-III raw materials should preferably be TMA (trimethylaluminum)/TMG (trimethylgallium) or TEG (triethylgallium)/TMI (trimethylindium).

In cases where an AlGaInN layer or a GaInN layer is to be caused to grow by use of the ordinary MOVPE technique, the raw materials described above are supplied onto the base plate with a hydrogen gas or a nitrogen gas being used as a carrier gas, and the film formation is performed under the conditions of the base plate temperature falling within the range of 800° C. to 1,100° C. In order for the raw materials described above to be decomposed just above the base plate, the temperature of approximately 1,000° C. is required. Particularly, for the decomposition of ammonia, the temperature of approximately 1,000° C. is required.

In cases where the AlGaInN layer or the GaInN layer is caused to grow on the ZnO base plate by use of the ordinary MOVPE technique, oxygen contained in the base plate is eliminated, and empty defects due to oxygen loss are formed on the base plate surface. The base plate is thus deteriorated, and a crystal having good quality is not capable of being grown.

The inventors have found that, in cases where the laser assisted MOVPE technique, with which the metalorganic vapor phase growth is performed while the laser beam is being irradiated to the base plate, is employed, the decomposition of the raw material, such as ammonia, is capable of being promoted by photon energy of the laser beam, and the AlGaInN layer or the GaInN layer is capable of being caused to grow at a low temperature.

Specifically, the semiconductor layer in accordance with the present invention is capable of being formed at a film formation temperature (a base plate temperature) of at most 800° C. The inventors have confirmed that the metalorganic vapor phase growth is capable of being performed at a temperature of at most 500° C. However, in cases where the film formation temperature is markedly high or markedly low, there is a tendency for the crystal quality to become unstable. The inventors have found that the film formation temperature should preferably fall within the range of 500° C. to 800° C., and that the best crystal quality is capable of being obtained at a film formation temperature of approximately 700° C.

As described above, in accordance with the present invention, the low temperature growth is capable of being performed. Therefore, in accordance with the present invention, in cases where the ZnO base plate is used as the base plate, the deterioration of the base plate is capable of being suppressed, and a crystal having good quality is capable of being caused to grow.

Figure 1B:
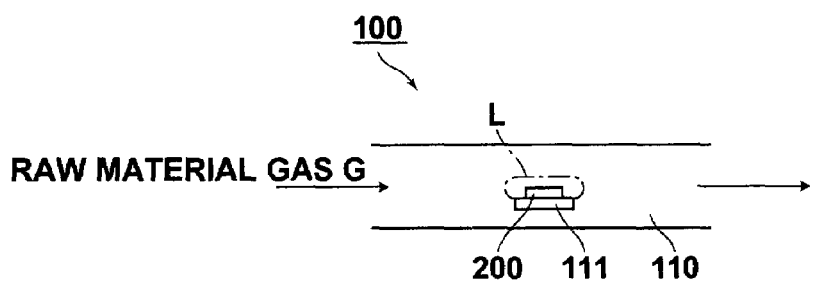
FIG. 1B is a schematic side view showing the film forming apparatus of FIG. 1A.

An example of a laser assisted MOVPE apparatus, which is appropriate for use in the film formation of the semiconductor layer in accordance with the present invention, will be described hereinbelow with reference to FIGS. 1A and 1B. FIG. 1A is a schematic plan view showing a film forming apparatus, which is appropriate for use in film formation of a semiconductor layer in accordance with the present invention. FIG. 1B is a schematic side view showing the film forming apparatus of FIG. 1A.

With reference to FIGS. 1A and 1B, a film forming apparatus 100 comprises a reaction tube 110, which is constituted such that at least a part for allowing the passage of a laser beam L has light transmissivity. The film forming apparatus 100 also comprises a laser beam irradiating optical system 120 for irradiating the laser beam L into the reaction tube 110. The laser beam L may be a continuous laser beam, typically a carbon dioxide laser beam. Alternatively, the laser beam L may be a pulsed laser beam, typically an excimer laser beam.

A receptor 111, which is made from carbon, or the like, and on which a base plate 200, such as the ZnO base plate, is supported, is located within the reaction tube 110. In the example illustrated in FIGS. 1A and 1B, the receptor 111 and the base plate 200 have circular disk-like shapes. The receptor 111 is capable of being heated to a desired temperature by a heater (not shown), and the base plate 200 is thus capable of being heated to the desired temperature. As described above, in accordance with the present invention, the film formation is capable of being performed at a film formation temperature (a base plate temperature) of at most 800° C.

A raw material gas G, which contains the Group-III raw materials (e.g., TMA/TEG/TMI), the Group-V raw material (e.g., ammonia), and, when necessary, a carrier gas, such as a hydrogen gas, is introduced into the reaction tube 110.

The laser beam irradiating optical system 120 comprises a laser beam source 121. The laser beam irradiating optical system 120 also comprises an enlarging lens 122 for enlarging the beam diameter of the laser beam having been radiated out from the laser beam source 121. The laser beam irradiating optical system 120 further comprises a collimator lens 123 for collimating the laser beam having been radiated out from the enlarging lens 122. The laser beam irradiating optical system 120 still further comprises a reflection mirror 124 for reflecting the laser beam, which has been radiated out from the collimator lens 123, toward the side of the base plate 200. It is sufficient for the laser beam irradiating optical system 120 to irradiate the laser beam L to the base plate 200, and the optical system may be designed in various other ways.

No limitation is imposed upon the laser beam source 121. However, the laser beam source 121 should preferably be an ultraviolet laser, which is capable of producing the laser beam having a wavelength falling within the range of 150 nm to 310 nm. The ultraviolet laser is advantageous in that photon energy is high, and in that the raw material decomposition promoting effect is expected to be large in view of the bond energy. Examples of the ultraviolet lasers include excimer lasers (such as ArF, KrF, XeCl, XeF, or $F_2$) and ultraviolet solid lasers.

The location of the laser beam irradiating optical system 120 is designed such that the laser beam L passes just above the base plate 200 and from one direction to the direction approximately parallel with the base plate surface of the base plate 200. Also, the enlarging optical system, or the like, of the laser beam irradiating optical system 120 is designed such that the laser beam L may be irradiated to the entire area of the surface of the base plate 200.

The direction of irradiation of the laser beam L may be designed arbitrarily. The laser beam L may be irradiated from a direction normal to the base plate surface or from a direction oblique with respect to the base plate surface. However, in cases where the laser beam L is irradiated from the direction normal to the base plate surface or from the direction oblique with respect to the base plate surface, there will be the risk, under certain conditions of irradiation, that the laser beam L will strongly impinge upon the base plate surface and will damage the base plate 200 or the growing crystal.

Therefore, as in the example illustrated in FIGS. 1A and 1B, the laser beam L should most preferably be irradiated to the base plate 200, such that the laser beam L may pass just above the base plate 200 and in the direction approximately parallel with the base plate surface of the base plate 200. In cases where the laser beam L is irradiated in the direction described above, damage to the base plate 200 is capable of being suppressed, and decomposition and elimination of the growing crystal by the laser beam L are capable of being suppressed.

The irradiation of the laser beam L to the base plate 200 may be performed with the laser beam profile, such that the distribution of the laser beam intensity, which distribution is taken in the direction parallel with the base plate surface, is approximately uniform, and such that the distribution of the laser beam intensity, which distribution is taken in the direction normal to the base plate surface, is the distribution approximately represented by the Gaussian distribution. In cases where the irradiation of the laser beam L to the base plate 200 is performed with the laser beam profile described above, approximately the entire area of the surface of the base plate 200 is capable of being processed approximately uniformly, and a film having uniform quality is capable of being caused to grow.

Figure 1C:
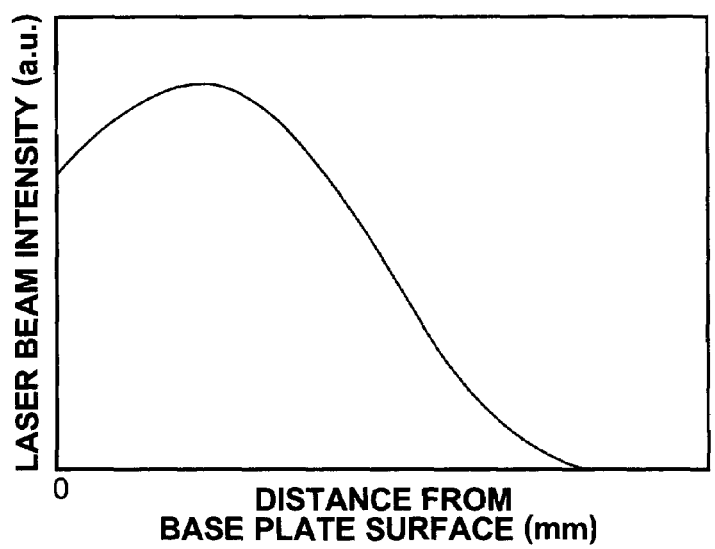
FIG. 1C is a graph showing an example of a laser beam profile.

FIG. 1C is a graph showing an example of a distribution of the laser beam intensity of the laser beam L, which distribution is taken in the direction normal to the base plate surface.

The laser beam L should preferably be irradiated to the base plate 200, such that the peak of the distribution of the laser beam intensity, which is taken in the direction normal to the base plate surface, is present within the range of at most 2 mm from the base plate surface, which range is taken in the direction normal to the base plate surface. In cases where the irradiation of the laser beam L is performed with the laser beam profile described above, the laser beam intensity of the laser beam L passing just above the base plate 200 is capable of being kept high, and the reaction for the vapor phase growth on the base plate 200 is capable of being performed efficiently.

Only one laser beam source 121 maybe utilized. Alternatively, a plurality of laser beam sources 121, 121, . . . may be utilized. In cases where the number of the laser beam sources 121, 121, . . . is set to be large, it is expected that the total laser beam quantity irradiated to the base plate 200 is capable of being set to be large, and that, as for certain kinds of the raw materials, the raw material decomposition is capable of being promoted even further.

In cases where the plurality of the laser beam sources 121, 121, . . . are utilized, the laser beams L, L, . . . having been produced by the plurality of the laser beam sources 121, 121, . . . may be irradiated to the base plate 200 in independent manners from different directions with respect to the base plate 200. Alternatively, the laser beams L, L, . . . having been produced by the plurality of the laser beam sources 121, 121, . . . may be combined together and irradiated as the combined laser beam to the base plate 200.

Also, in cases where the plurality of the laser beam sources 121, 121, . . . are utilized, the laser beams L, L, . . . having been produced by the plurality of the laser beam sources 121, 121, . . . may have an identical wavelength. Alternatively, the laser beams L, L, . . . having been produced by the plurality of the laser beam sources 121, 121, . . . may have different wavelengths.

In cases where, for example, multiple kinds of film formation raw materials are used, the plurality of the laser beam sources 121, 121, . . . capable of producing the laser beams L, L, . . . having different wavelengths should preferably be used. Also, in such cases, the laser beams L, L, . . . having the different wavelengths should preferably be irradiated in the independent manners to the base plate 200. Alternatively, in such cases, the laser beams L, L, . . . having the different wavelengths should preferably be combined together and irradiated as the combined laser beam to the base plate 200. In cases where the multiple kinds of the film formation raw materials varying in bond energy are used, the wavelengths of the laser beams L, L, . . . produced by the plurality of the laser beam sources 121, 121, . . . should preferably be varied in accordance with the bond energy of the multiple kinds of the film formation raw materials. In such cases, the multiple kinds of the film formation raw materials are capable of being decomposed efficiently.

In cases where the film forming apparatus 100 having the constitution described above is used, the metalorganic vapor phase growth is capable of being performed, while the laser beam L (preferably the ultraviolet laser beam) is being irradiated to the base plate 200, and the AlGaInN layer or the GaInN layer is capable of being caused to grow at a low temperature.

As described above, with the constitution in accordance with the present invention, the AlGaInN layer or the GaInN layer is caused to grow on the base plate, such as the ZnO base plate, by use of the laser assisted MOVPE technique. With the constitution in accordance with the present invention, the growth at a low temperature is capable of being achieved. Also, the AlGaInN layer or the GaInN layer is capable of being caused to grow on the base plate, such that the deterioration of the base plate may be suppressed, and such that the formed layer may have good crystalline characteristics.

First Embodiment of Semiconductor Light Emitting Device (Semiconductor Laser)

A semiconductor laser, which acts as a first embodiment of the semiconductor light emitting device in accordance with the present invention, will be described hereinbelow with reference to FIGS. 2A and 2B. FIG. 2A is a sectional view showing a semiconductor laser, which acts as a first embodiment of the semiconductor light emitting device in accordance with the present invention. FIG. 2B is an enlarged sectional view showing a semiconductor active layer constituting the semiconductor laser of FIG. 2A.

With reference to FIG. 2A, this embodiment of a semiconductor laser (a semiconductor light emitting device) 1 comprises an n-type (i.e., a first electrical conduction type) semiconductor base plate 11. The semiconductor laser 1 also comprises an n-type cladding layer 12, a non-doped lower light guiding layer 13, a semiconductor active layer 14, a non-doped upper light guiding layer 15, a p-type (i.e., a second electrical conduction type) cladding layer 16, a p-type contact layer 17, an insulating film 20, and a p-type electrode 21, which are overlaid on a top surface of the n-type semiconductor base plate 11 and in this order from the side of the n-type semiconductor base plate 11. Further, an n-type electrode 22 is formed on the bottom surface of the n-type semiconductor base plate 11.

In this embodiment, as illustrated in FIG. 2B, the semiconductor active layer 14 is a multiple quantum well active layer having a laminate structure comprising quantum well layers 14A, 14A, 14A and barrier layers 14B, 14B, which are overlaid alternately.

In this embodiment of the semiconductor laser 1, the insulating film 20 is formed in a pattern having an aperture 20A. Also, each of the other layers is formed over the entire area of the surface of the n-type semiconductor base plate 11. Specifically, this embodiment of the semiconductor laser 1 has a striped structure, in which an electric current flows selectively only through the opening region of the aperture 20A of the insulating film 20.

Design examples of the composition of the n-type semiconductor base plate 11, the composition of each of the layers, and the thickness of each of the layers will be described below.

n-Type semiconductor base plate 11:
    n-ZnO (0001) base plate
n-Type cladding layer 12:
    n-$Al_{0.34}Ga_{0.41}In_{0.25}N$ layer (thickness: 1.2 μm)
Non-doped lower light guiding layer 13:
    $Al_{0.1}Ga_{0.7}In_{0.2}N$ layer (thickness: 0.1 μm)
Semiconductor active layer 14:
    A laminate structure comprising $Ga_{0.82}In_{0.18}N$ quantum well layers (thickness of each layer: 3 nm, a total of three layers) and $Al_{0.1}Ga_{0.7}In_{0.2}N$ barrier layers (thickness of each layer: 5 nm, a total of two layers), which are overlaid alternately
Non-doped upper light guiding layer 15:
    $Al_{0.1}Ga_{0.7}In_{0.2}N$ layer (thickness: 0.1 μm)
p-Type cladding layer 16:
    p-$Al_{0.34}Ga_{0.41}In_{0.25}N$ layer (thickness: 1.2 μm)
p-Type contact layer 17:
    p-$Ga_{0.82}In_{0.18}N$ layer (thickness: 0.2 μm)

In this embodiment, the layer compositions are adjusted such that the n-type cladding layer 12, the non-doped lower light guiding layer 13, the non-doped upper light guiding layer 15, the p-type cladding layer 16, and the p-type contact layer 17 are approximately lattice matched with the n-type semiconductor base plate 11.

Also, the layer compositions are adjusted such that the lattice constant of each of the quantum well layers 14A, 14A, 14A constituting the semiconductor active layer 14 is larger than the lattice constant of the n-type semiconductor base plate 11, and such that the barrier layers 14B, 14B constituting the semiconductor active layer 14 are approximately lattice matched with the n-type semiconductor base plate 11.

In cases where the relationships of the lattice constants are set in the manner described above, the wavelength of the produced laser beam is capable of being shifted to the longer wavelength side, and the production of the laser beam having a wavelength falling within the wavelength range up to the red wavelength region of 630 nm becomes possible. Also, since the effect of lowering the threshold current due to strain is capable of being obtained, the actuation current is capable of being set to be low, and the effects of enhancing the efficiency and suppressing the electric power consumption are capable of being obtained.

In this embodiment, each of the semiconductor layers ranging from the n-type cladding layer 12 to the p-type contact layer 17 is the semiconductor layer in accordance with the present invention, which has been formed with the laser assisted MOVPE technique.

This embodiment of the semiconductor laser 1 is constituted in the manner described above.

This embodiment of the semiconductor laser 1 is produced with a process, in which the ZnO base plate is used as the n-type semiconductor base plate 11, and in which the semiconductor layers 12 to 17, each of which is the AlGaInN layer or the GaInN layer, are formed on the n-type semiconductor base plate 11 by use of the laser assisted MOVPE technique. With this embodiment, the AlGaInN layer or the GaInN layer is capable of being caused to grow on the n-type semiconductor base plate 11, such that the deterioration of the n-type semiconductor base plate 11 at the time of the production may be suppressed, and such that the formed layer may have good crystalline characteristics. Also, in this embodiment of the semiconductor laser 1, in contrast with the semiconductor laser proposed in, for example, Japanese Unexamined Patent Publication No. 1(1989)-017484, the semiconductor active layer 14 has the multiple quantum well structure.

With this embodiment of the semiconductor laser 1, in which the deterioration of the n-type semiconductor base plate 11 is capable of being suppressed, in which the semiconductor layers 12 to 17 have good crystalline characteristics, and in which the semiconductor active layer 14 has the multiple quantum well structure, by virtue of the effects of the features described above, the semiconductor laser having a high efficiency and good light emission characteristics is capable of being obtained.

With the constitution of this embodiment, it is possible to furnish the semiconductor laser 1, which is capable of producing the laser beam having a wavelength falling within the range of 480 nm to 630 nm. With this embodiment, it is possible to obtain the semiconductor laser 1, which has a high efficiency and is capable of producing the laser beam having the wavelength falling within the green to yellow light wavelength region, and which was not capable of being used in practice in the past. (Reference may be made to Example 1, which will be described later.)

In the embodiment described above, the electrically conductive ZnO base plate may be used as the n-type semiconductor base plate 11. In such cases, the n-type semiconductor base plate 11 may act also as the n-type electrode 22.

Second Embodiment of Semiconductor Light Emitting Device (Semiconductor Laser)

A single transverse mode semiconductor laser, which acts as a second embodiment of the semiconductor light emitting device in accordance with the present invention, will be described hereinbelow with reference to FIG. 3. FIG. 3 is a sectional view showing a single transverse mode semiconductor laser, which acts as a second embodiment of the semiconductor light emitting device in accordance with the present invention. In FIG. 3, similar elements are numbered with the same reference numerals with respect to FIG. 2A.

With reference to FIG. 3, this embodiment of a semiconductor laser (a semiconductor light emitting device) 2 comprises the n-type (i.e., the first electrical conduction type) semiconductor base plate 11. The semiconductor laser 2 also comprises the n-type cladding layer 12, the non-doped lower light guiding layer 13, the semiconductor active layer 14, the non-doped upper light guiding layer 15, a p-type (i.e., the second electrical conduction type) first cladding layer 16, an n-type current blocking layer 18, a p-type second cladding layer 19, the p-type contact layer 17, and the p-type electrode 21, which are overlaid on the top surface of the n-type semiconductor base plate 11 and in this order from the side of the n-type semiconductor base plate 11. Further, the n-type electrode 22 is formed on the bottom surface of the n-type semiconductor base plate 11.

This embodiment of the semiconductor laser 2 is produced with a process described below. Specifically, after the entire area of the p-type first cladding layer 16 has been formed, partial regions of the p-type first cladding layer 16 are selectively removed by etching processing, and a ridge stripe section 16A is thereby formed. Thereafter, the n-type current blocking layer 18 is caused to grow selectively in the regions on the p-type first cladding layer 16, in which regions the ridge stripe section 16A has not been formed, such that the n-type current blocking layer 18 may sandwich the ridge stripe section 16A. Thereafter, the p-type second cladding layer 19, the p-type contact layer 17, and the p-type electrode 21 are formed on the entire areas of the top surfaces of the ridge stripe section 16A and the n-type current blocking layer 18. This embodiment of the semiconductor laser 2 has a striped structure, in which an electric current flows selectively only through the region, in which the ridge stripe section 16A of the p-type first cladding layer 16 has been formed.

In this embodiment, though not shown, the semiconductor active layer 14 is a multiple quantum well active layer having a laminate structure comprising quantum well layers 14A, 14A, 14A, 14A and barrier layers 14B, 14B, 14B, which are overlaid alternately. (Reference may be made to FIG. 2B.)

Design examples of the composition of the n-type semiconductor base plate 11, the composition of each of the layers, and the thickness of each of the layers will be described below.

n-Type semiconductor base plate 11:
 n-ZnO (0001) base plate
n-Type cladding layer 12:
 n-$Al_{0.34}Ga_{0.41}In_{0.25}N$ layer (thickness: 2.0 μm)
Non-doped lower light guiding layer 13:
 $Al_{0.1}Ga_{0.7}In_{0.2}N$ layer (thickness: 0.1 μm)
Semiconductor active layer 14:
 A laminate structure comprising $Ga_{0.75}In_{0.25}N$ strained quantum well layers (thickness of each layer: 2.4 nm, a total of four layers) and $Ga_{0.8\ 2}In_{0.18}N$ barrier layers (thickness of each layer: 4 nm, a total of three layers), which are overlaid alternately
Non-doped upper light guiding layer 15:
 $Al_{0.1}Ga_{0.7}In_{0.2}N$ layer (thickness: 0.1 μm)
p-Type first cladding layer 16:
 p-$Al_{0.34}Ga_{0.41}In_{0.25}N$ layer (entire thickness: approximately 1.0 μm, width of the ridge stripe section 16A: 2 μm, height of the ridge stripe section 16A: 0.5 μm)
n-Type current blocking layer 18:
 n-$Al_{0.68}In_{0.32}N$ layer (thickness: 0.5 μm)
p-Type second cladding layer 19:
 p-$Al_{0.34}Ga_{0.41}In_{0.25}N$ layer (thickness: 2.5 μm)
p-Type contact layer 17:
 p-$Ga_{0.82}In_{0.18}N$ layer (thickness: 0.2 μm)

In this embodiment, the layer compositions are adjusted such that the semiconductor layers 12 to 19 ranging from the n-type cladding layer to the p-type contact layer are approximately lattice matched with the n-type semiconductor base plate 11. Each of the semiconductor layers 12 to 19 is the semiconductor layer in accordance with the present invention, which has been formed with the laser assisted MOVPE technique.

This embodiment of the semiconductor laser 2 is constituted in the manner described above.

This embodiment of the semiconductor laser 2 is produced with a process, in which the Z no base plate is used as the n-type semiconductor base plate 11, and in which the semiconductor layers 12 to 19, each of which is the AlGaInN layer or the GaInN layer, are formed on the n-type semiconductor base plate 11 by use of the laser assisted MOVPE technique. With this embodiment, the AlGaInN layer or the GaInN layer is capable of being caused to grow on the n-type semiconductor base plate 11, such that the deterioration of the n-type semiconductor base plate 11 at the time of the production may be suppressed, and such that the formed layer may have good crystalline characteristics. Also, in this embodiment of the semiconductor laser 2, in contrast with the semiconductor laser proposed in, for example, Japanese Unexamined Patent Publication No. 1(1989)-017484, the semiconductor active layer 14 has the multiple quantum well structure.

With this embodiment of the semiconductor laser 2, in which the deterioration of the n-type semiconductor base plate 11 is capable of being suppressed, in which the semiconductor layers 12 to 19 have good crystalline characteristics, and in which the semiconductor active layer 14 has the multiple quantum well structure, by virtue of the effects of the features described above, the semiconductor laser having a high efficiency and good light emission characteristics is capable of being obtained.

With the constitution of this embodiment, it is possible to furnish the semiconductor laser 2, which is capable of producing the laser beam having a wavelength falling within the range of 480 nm to 630 nm. With this embodiment, it is possible to obtain the semiconductor laser 2, which has a high efficiency and is capable of producing the laser beam having the wavelength falling within the green to yellow light wavelength region, and which was not capable of being used in practice in the past. (Reference may be made to Example 2, which will be described later.)

In the embodiment described above, the electrically conductive ZnO base plate may be used as the n-type semiconductor base plate 11. In such cases, the n-type semiconductor base plate 11 may act also as the n-type electrode 22.

Third Embodiment of Semiconductor Light Emitting Device (Light Emitting Diode)

A light emitting diode, which acts as a third embodiment of the semiconductor light emitting device in accordance with the present invention, will be described hereinbelow with reference to FIGS. 4A and 4B. FIG. 4A is a sectional view showing a light emitting diode, which acts as a third embodiment of the semiconductor light emitting device in accordance with the present invention. FIG. 4B is a band diagram showing a base plate and principal layers constituting the light emitting diode of FIG. 4A.

With reference to FIG. 4A, as in the first embodiment described above, this embodiment of a light emitting diode (a semiconductor light emitting device) 3 comprises the n-type (i.e., the first electrical conduction type) semiconductor base plate 11. The light emitting diode 3 also comprises the n-type cladding layer 12, the non-doped lower light guiding layer 13, the semiconductor active layer 14, the non-doped upper light guiding layer 15, the p-type (i.e., the second electrical conduction type) cladding layer 16, the p-type contact layer 17, the insulating film 20, and the p-type electrode 21, which are overlaid on the top surface of the n-type semiconductor base plate 11 and in this order from the side of the n-type semiconductor base plate 11. Further, the n-type electrode 22 is formed on the bottom surface of the n-type semiconductor base plate 11.

In this embodiment, as illustrated in FIG. 4B, the semiconductor active layer 14 is a multiple quantum well active layer having a laminate structure comprising quantum well layers 14A, 14A, 14A, 14A and barrier layers 14B, 14B, 14B, which are overlaid alternately. (Reference may also be made to FIG. 2B.)

In this embodiment of the light emitting diode 3, the insulating film 20 is formed in the pattern having the aperture 20A. Also, the n-type electrode 22 is formed in a pattern having an aperture 22A. Further, each of the other layers is formed over the entire area of the surface of the n-type semiconductor base plate 11. The aperture 20A of the insulating film 20 and the aperture 22A of the n-type electrode 22 are open at approximately identical positions and with approximately identical widths. Specifically, this embodiment of the light emitting diode 3 has a striped structure, in which an electric current flows selectively only through the opening region of the aperture 20A of the insulating film 20. Also, light is taken out through the aperture 22A of the n-type electrode 22 to the exterior.

Design examples of the composition of the n-type semiconductor base plate 11, the composition of each of the layers, and the thickness of each of the layers will be described below.

n-Type semiconductor base plate 11:
    n-ZnO (0001) base plate n-Type cladding layer 12:
    n-$Al_{0.34}Ga_{0.41}In_{0.25}N$ layer (thickness: 3 µm)

Non-doped lower light guiding layer 13:
    $Al_{0.1}Ga_{0.7}In_{0.2}N$ layer (thickness: 0.2 µm)

Semiconductor active layer 14:
    A laminate structure comprising $Ga_{0.82}In_{0.18}N$ quantum well layers (a total of four layers) and $Al_{0.1}Ga_{0.7}In_{0.2}N$ barrier layers (a total of three layers), which are overlaid alternately Non-doped upper light guiding layer 15:
    $Al_{0.1}Ga_{0.7}In_{0.2}N$ layer (thickness: 0.2 µm)

p-Type cladding layer 16:
    p-$Al_{0.34}Ga_{0.41}In_{0.25}N$ layer (thickness: 3.0 µm)

p-Type contact layer 17:
    p-$Ga_{0.82}In_{0.18}N$ layer (thickness: 0.2 µm)

In this embodiment, the plurality of the quantum well layers 14A, 14A, . . . (in this case, the four quantum well layers 14A, 14A, 14A, 14A) constituting the semiconductor active layer 14 are designed so as to vary in transition wavelength. In this embodiment, the plurality of the quantum well layers 14A, 14A, . . . constituting the semiconductor active layer 14 have an identical composition and have different thicknesses. The transition wavelengths of the quantum well layers 14A, 14A, . . . are thereby set to be different from one another, and the wavelengths of the light beams produced by the quantum well layers 14A, 14A, . . . are designed to be different from one another.

The layer number of the quantum well layers 14A, 14A, . . . constituting the semiconductor active layer 14 may be designed arbitrarily. Such that the light emission spectrum may be set to be of a broad band, or such that the light emission spectrum may be set to be of a smooth spectral shape, the number of the quantum well layers 14A, 14A, . . . may be set to be at least five. Conversely, the number of the quantum well layers 14A, 14A, . . . may be set to be at most three.

As described above, in this embodiment, the plurality of the quantum well layers 14A, 14A, . . . constituting the semiconductor active layer 14 have an identical composition and have different thicknesses. In cases where the plurality of the quantum well layers 14A, 14A, . . . constituting the semiconductor active layer 14 are set so as to vary in composition and/or thickness, the transition wavelengths of the quantum well layers 14A, 14A, . . . are capable of being set to be different from one another.

In order for the light to be taken out from the side of the n-type electrode 22, the transition wavelengths of the plurality of the quantum well layers 14A, 14A, . . . constituting the semiconductor active layer 14 should preferably be designed such that the transition wavelength of the quantum well layer 14A, which is located closest to the n-type semiconductor base plate 11, is the shortest, and the transition wavelengths of the quantum well layers 14A, 14A, . . . are set to be long successively as the positions of the quantum well layers 14A, 14A, ... become remote from the n-type semiconductor base plate 11.

In this embodiment, as in the first embodiment described above, the layer compositions are adjusted such that the n-type cladding layer 12, the non-doped lower light guiding layer 13, the non-doped upper light guiding layer 15, the p-type cladding layer 16, and the p-type contact layer 17 are approximately lattice matched with the n-type semiconductor base plate 11.

Also, the layer compositions are adjusted such that the lattice constant of each of the quantum well layers 14A, 14A, ... constituting the semiconductor active layer 14 is larger than the lattice constant of the n-type semiconductor base plate 11, and such that the barrier layers 14B, 14B, ... constituting the semiconductor active layer 14 are approximately lattice matched with the n-type semiconductor base plate 11.

In this embodiment, each of the semiconductor layers ranging from the n-type cladding layer 12 to the p-type contact layer 17 is the semiconductor layer in accordance with the present invention, which has been formed with the laser assisted MOVPE technique.

This embodiment of the light emitting diode 3 is constituted in the manner described above.

This embodiment of the light emitting diode 3 is produced with the process, in which the ZnO base plate is used as the n-type semiconductor base plate 11, and in which the semiconductor layers 12 to 17, each of which is the AlGaInN layer or the GaInN layer, are formed on the n-type semiconductor base plate 11 by use of the laser assisted MOVPE technique. With this embodiment, the AlGaInN layer or the GaInN layer is capable of being caused to grow on the n-type semiconductor base plate 11, such that the deterioration of the n-type semiconductor base plate 11 at the time of the production may be suppressed, and such that the formed layer may have good crystalline characteristics. Also, in this embodiment of the light emitting diode 3, in contrast with the technique proposed in, for example, Japanese Unexamined Patent Publication No. 1(1989)-017484, the semiconductor active layer 14 has the multiple quantum well structure.

With this embodiment of the light emitting diode 3, in which the deterioration of the n-type semiconductor base plate 11 is capable of being suppressed, in which the semiconductor layers 12 to 17 have good crystalline characteristics, and in which the semiconductor active layer 14 has the multiple quantum well structure, by virtue of the effects of the features described above, the light emitting diode having a high efficiency and good light emission characteristics is capable of being obtained.

With the constitution of this embodiment, it is possible to furnish the white light emitting diode, which is capable of directly producing the white light from the semiconductor active layer 14. (Reference may be made to Example 3, which will be described later.) With the white light emitting diode in accordance with the present invention, a markedly higher light emission efficiency is capable of being obtained, and electric power consumption is capable of being kept markedly lower than with the conventional white light emitting diode, in which the fluorescent substances are excited by the blue light emitting diode, in which the light having been produced by the blue light emitting diode and the light having been produced by the fluorescent substances are combined together, and in which the white light is thus obtained indirectly.

In the embodiment described above, the electrically conductive ZnO base plate may be used as the n-type semiconductor base plate 11. In such cases, the n-type semiconductor base plate 11 may act also as the n-type electrode 22.

Figure 6:
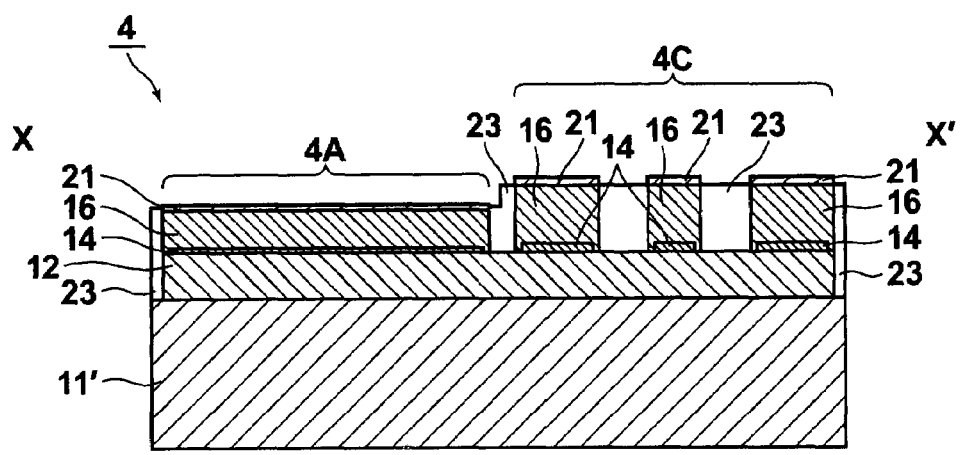
FIG. 6 is a sectional view taken on line X-X' of FIG. 5A.

Fourth Embodiment of Semiconductor Light Emitting Device (Light Emitting Diode) and Semiconductor Light Emitting Apparatus Provided with the Same A light emitting diode, which acts as a fourth embodiment of the semiconductor light emitting device in accordance with the present invention, will be described hereinbelow with reference to FIG. 5A and FIG. 6. Also, a semiconductor light emitting apparatus provided with the light emitting diode having been mounted on a mounting base plate will be described hereinbelow with reference to FIGS. 5B and 5C. FIG. 5A is a perspective view showing a light emitting diode, which acts as a fourth embodiment of the semiconductor light emitting device in accordance with the present invention. FIG. 5B is a perspective view showing a semiconductor light emitting apparatus, which is provided with the light emitting diode of FIG. 5A, with a sealing resin being omitted for clearness. FIG. 5C is a perspective view showing the semiconductor light emitting apparatus of FIG. 5B, with the sealing resin being illustrated. FIG. 6 is a sectional view taken on line X-X' of FIG. 5A. In FIG. 5A and FIG. 6, similar elements are numbered with the same reference numerals with respect to FIG. 4A.

With reference to FIG. 5A, this embodiment of a light emitting diode (a semiconductor light emitting device) 4 comprises an n-type (i.e., the first electrical conduction type) semiconductor base plate 11'. The light emitting diode 4 also comprises the n-type cladding layer 12, the non-doped lower light guiding layer 13 (not shown), the semiconductor active layer 14, the non-doped upper light guiding layer 15 (not shown), the p-type (i.e., the second electrical conduction type) cladding layer 16, the p-type contact layer 17 (not shown), and the p-type electrode 21, which are overlaid on the top surface of the n-type semiconductor base plate 11' and in this order from the side of the n-type semiconductor base plate 11'. (As for the non-doped lower light guiding layer 13, the non-doped upper light guiding layer 15, and the p-type contact layer 17, reference may be made to FIG. 4A.)

In this embodiment, the semiconductor active layer 14 is a multiple quantum well active layer having a laminate structure comprising the quantum well layers 14A, 14A, ... and the barrier layers 14B, 14B, ..., which are overlaid alternately. (Reference may be made to FIG. 2B.) In this embodiment, the n-type semiconductor base plate 11' is constituted of the electrically conductive ZnO base plate and acts also as the n-type (i.e., the first electrical conduction type) electrode.

As described above, in the third embodiment of the light emitting diode 3, the transition wavelengths of the plurality of the quantum well layers 14A, 14A, ... constituting the semiconductor active layer 14 are set to be different from one another, and the white light emission is thereby accomplished. In the fourth embodiment of the light emitting diode 4, in contrast with the third embodiment, the light emitting diode 4 comprises a plurality of light emitting sections 4A, 4B, 4C, and 4D, the center emission wavelengths of the light emitting sections 4A, 4B, 4C, and 4D are set to be different from one another, and the white light emission is thereby accomplished. In this embodiment, the number of the light emitting sections is set at four. However, the number of the light emitting sections may be designed arbitrarily. The constitution itself of the light emitting diode, in which the plurality of the light emitting sections varying in center emission wavelength are provided, and in which the mixed light of the light having been produced by the light emitting sections is obtained, is the novel constitution.

As illustrated in FIG. 6, in this embodiment, the n-type cladding layer 12 and the non-doped lower light guiding layer 13 (not shown) are formed over the entire area of the surface of the n-type semiconductor base plate 11'. Also, the semiconductor active layer 14, the non-doped upper light guiding layer 15 (not shown), the p-type first cladding layer 16, the p-type contact layer 17 (not shown), and the p-type electrode 21 are formed in predetermined patterns on the non-doped lower light guiding layer 13 (not shown).

At the plurality of the light emitting sections 4A, 4B, 4C, and 4D, of the side of the n-type electrode (in this case, the n-type semiconductor base plate 11') and the side of the p-type electrode 21, the p-type electrodes 21, 21, 21, 21 of the light emitting sections 4A, 4B, 4C, and 4D are electrically isolated from one another.

In this embodiment, the semiconductor active layer 14 and the layers located on the side upward from the semiconductor active layer 14 are formed with a selective growth technique utilizing insulating film masks 23, 23, . . . . As for each of the light emitting sections 4A, 4B, 4C, and 4D, the opening rate of the insulating film masks 23, 23, . . . is altered, and the area of the semiconductor active layer 14 is thereby altered.

Specifically, at the light emitting section 4A, the insulating film masks 23, 23, . . . are not formed, and the area of the light emitting section 4A and the area of the semiconductor active layer 14 coincide with each other. At each of the light emitting sections 4B, 4C, and 4D, the insulating film masks 23, 23, . . . are formed. In this embodiment, the insulating film masks 23, 23, . . . are formed such that the formation area of the insulating film masks 23, 23, . . . becomes large (i.e., the opening rate of the insulating film masks 23, 23, . . . becomes small) in the order of the light emitting section 4B, the light emitting section 4C, and the light emitting section 4D. Therefore, the area of the semiconductor active layer 14 becomes small in the order of the light emitting section 4A, the light emitting section 4B, the light emitting section 4C, and the light emitting section 4D. The opening rate and the opening pattern of the insulating film masks 23, 23, . . . are not limited to the examples illustrated in FIG. 5A and may be designed arbitrarily.

The crystal growth areas of the semiconductor active layer 14 and the layers located on the side upward from the semiconductor active layer 14 are determined by the opening rate of the insulating film masks 23, 23, . . . . Also, the crystal growth rate varies in accordance with the crystal growth area. Therefore, the thicknesses and the compositions of the semiconductor active layer 14 and the layers located on the side upward from the semiconductor active layer 14 are capable of being altered for each of the light emitting sections 4A, 4B, 4C, and 4D.

In this embodiment, the opening rate of the insulating film masks 23, 23, . . . is varied for the light emitting sections 4A, 4B, 4C, and 4D. In this manner, the area, the thickness, and the composition of the semiconductor active layer 14 are altered, and the center emission wavelengths of the light emitting sections 4A, 4B, 4C, and 4D are set at different values. In cases where at least one characteristic selected from among the area, the thickness, and the composition of the semiconductor active layer 14 is varied for each of the light emitting sections 4A, 4B, 4C, and 4D, the center emission wavelengths of the light emitting sections 4A, 4B, 4C, and 4D are capable of being varied.

Design examples of the composition of the n-type semiconductor base plate 11', the composition of each of the layers, and the opening rate of the insulating film masks 23, 23, . . . will be described below.

n-Type semiconductor base plate 11':
 Electrically conductive n-ZnO (0001) base plate
n-Type cladding layer 12:
 n-$Al_{0.34}Ga_{0.41}In_{0.25}N$ layer
Non-doped lower light guiding layer 13:
 $Ga_{0.82}In_{0.18}N$ layer
Semiconductor active layer 14:
 A laminate structure comprising $Ga_{0.75}In_{0.25}N$ strained quantum well layers (a total of four layers) and $Ga_{0.82}In_{0.18}N$ barrier layers (a total of three layers), which are overlaid alternately
Non-doped upper light guiding layer 15:
 $Ga_{0.82}In_{0.18}N$ layer
p-Type cladding layer 16:
 p-$Al_{0.34}Ga_{0.41}In_{0.25}N$ layer
p-Type contact layer 17:
 p-$Ga_{0.82}In_{0.18}N$ layer
Insulating film masks 23, 23, . . . :
 $SiO_2$
Opening rate of insulating film masks 23, 23, . . . :
 100% (light emitting section 4A)/
 90% (light emitting section 4B)/
 75% (light emitting section 4C)/
 50% (light emitting section 4D)

With the design examples described above, the inventors have accomplished, for example, a center emission wavelength of 450 nm (at the light emitting section 4A)/a center emission wavelength of 520 nm (at the light emitting section 4B)/a center emission wavelength of 580 nm (at the light emitting section 4C)/a center emission wavelength of 630 nm (at the light emitting section 4D). Also, the inventors have accomplished the white light emission by the color mixing of the light emitted by the light emitting sections 4A, 4B, 4C, and 4D.

In this embodiment, each of the semiconductor layers ranging from the n-type cladding layer 12 to the p-type contact layer 17 is the semiconductor layer in accordance with the present invention, which has been formed with the laser assisted MOVPE technique.

This embodiment of the light emitting diode 4 is constituted in the manner described above.

This embodiment of the light emitting diode 4 is produced with the process, in which the ZnO base plate is used as the n-type semiconductor base plate 11', and in which the semiconductor layers 12 to 17, each of which is the AlGaInN layer or the GaInN layer, are formed on the n-type semiconductor base plate 11 by use of the laser assisted MOVPE technique. With this embodiment, the AlGaInN layer or the GaInN layer is capable of being caused to grow on the n-type semiconductor base plate 11', such that the deterioration of the n-type semiconductor base plate 11' at the time of the production may be suppressed, and such that the formed layer may have good crystalline characteristics. Also, in this embodiment of the light emitting diode 4, in contrast with the technique proposed in, for example, Japanese Unexamined Patent Publication No. 1(1989)-017484, the semiconductor active layer 14 has the multiple quantum well structure.

With this embodiment of the light emitting diode 4, in which the deterioration of the n-type semiconductor base plate 11' is capable of being suppressed, in which the semiconductor layers 12 to 17 have good crystalline characteristics, and in which the semiconductor active layer 14 has the multiple quantum well structure, by virtue of the effects of the features described above, the light emitting diode having a high efficiency and good light emission characteristics is capable of being obtained.

With the constitution of this embodiment, it is possible to accomplish the white light emitting diode. With the white light emitting diode in accordance with the present invention, a markedly higher light emission efficiency is capable of being obtained, and electric power consumption is capable of being kept markedly lower than with the conventional white light emitting diode, in which the fluorescent substances are excited by the blue light emitting diode, in which the light having been produced by the blue light emitting diode and the light having been produced by the fluorescent substances are combined together, and in which the white light is thus obtained indirectly.

This embodiment of the light emitting diode 4 also has the advantages of longer light emission life time over the conventional white light emitting diode, in which the fluorescent substances are excited by the blue light emitting diode, in which the light having been produced by the blue light emitting diode and the light having been produced by the fluorescent substances are combined together, and in which the white light is thus obtained indirectly.

A ZnO base plate, which is transparent with respect to visible light and which has high electric conductivity, is available commercially. In this embodiment of the light emitting diode 4, the electrically conductive ZnO base plate is used as the n-type semiconductor base plate 11', and the n-type semiconductor base plate 11' acts also as the n-type electrode.

In conventional white light emitting diodes, an n-type SiC base plate or an n-type GaN base plate is ordinarily used. In such cases, it is essential to use an n-type electrode. Examples of the n-type electrodes include indium tin oxide (ITO), a very thin metal film, and a mesh-like metal film. The above-enumerated n-type electrodes are accompanied by slight loss and constitute a factor for lowering the light take-out efficiency. In this embodiment, in which the n-type semiconductor base plate 11' acts also as the n-type electrode, the light take-out efficiency is capable of being kept higher than with the conventional light emitting diode provided with an n-type electrode.

In this embodiment, the ZnO base plate has the flat surface. In order for the light take-out efficiency to be enhanced, recesses and protrusions should preferably be formed on the surface of the ZnO base plate. By way of example, the recess and protrusion shapes on the surface of the ZnO base plate should preferably be of a moth-eye structure, in which small circular cone shapes or small pyramidal shapes stand side by side in an array pattern. The sizes of the recess and protrusion shapes on the surface of the ZnO base plate should preferably be approximately identical with wavelengths or smaller than the wavelengths.

With reference to FIG. 5B, a semiconductor light emitting apparatus 5 comprises a mounting base plate 30 having a surface, on which electrodes 31, 31, wiring, and the like, have been formed in predetermined patterns. The semiconductor light emitting apparatus 5 also comprises the light emitting diode 4 described above, which has been mounted on a heat sink of the mounting base plate 30.

This embodiment of the semiconductor light emitting apparatus 5 employs the so-called junction technique, in which the side of the p-type electrode 21 of the light emitting diode 4 is fusion bonded to the mounting base plate 30. Also, the n-type semiconductor base plate 11' of the light emitting diode 4, which base plate acts also as the n-type electrode, and the mounting base plate 30 are electrically connected with each other by bonding wires 33, 33, which may be gold wires, or the like.

As described above, the light emitting sections 4A, 4B, 4C, and 4D of the light emitting diode 4 vary in center emission wavelength. Therefore, appropriate actuation voltages vary even slightly for the light emitting sections 4A, 4B, 4C, and 4D. Accordingly, this embodiment of the semiconductor light emitting apparatus 5 is provided with a current control section 32 for controlling and optimizing the electric currents caused to flow across the light emitting sections 4A, 4B, 4C, and 4D. In this embodiment of the semiconductor light emitting apparatus 5, the current control section 32 comprises resistors 32A, 32B, 32C, and 32D varying in resistance value. Each of the resistors 32A, 32B, 32C, and 32D is inserted in series between the electrodes 31, 31 and each of the light emitting sections 4A, 4B, 4C, and 4D.

The electric current caused to flow across each of the light emitting sections 4A, 4B, 4C, and 4D is capable of being optimized by the current control section 32. Therefore, adjustment of the color temperature is capable of being performed. In accordance with the design conditions, it may often occur that the electric currents caused to flow across the light emitting sections 4A, 4B, 4C, and 4D should preferably be identical with one another. In such cases, by use of the current control section 32, the electric currents caused to flow across the light emitting sections 4A, 4B, 4C, and 4D are capable of being set to be identical with one another.

This embodiment of the semiconductor light emitting apparatus 5 has the constitution, such that the electric currents caused to flow across the light emitting sections 4A, 4B, 4C, and 4D are controlled and optimized with the current control section 32 formed on the semiconductor light emitting apparatus 5. The constitution described above is convenient for preparation of commodity line-up. For example, in cases where commodity line-up varying in color temperature is to be prepared, the kinds of products of the semiconductor light emitting apparatus 5 need not be increased, and the resistors loaded on the semiconductor light emitting apparatus 5 may merely be altered for coping with different kinds of products. The feature described above is advantageous for keeping the cost low.

As illustrated in FIG. 5C, the region of the semiconductor light emitting apparatus 5 other than the electrodes 31, 31 are sealed with a sealing resin 34 having the light transmissivity.

This embodiment of the semiconductor light emitting apparatus 5 is constituted in the manner described above.

The life time of the conventional white light emitting diodes is limited by the deterioration of the sealing resin. It has been thought that the deterioration of the sealing resin is caused to occur by blue light having high photon energy. Recently, the problems described above constitute detrimental problems for enhancement of the output of light emitting diodes. For the reasons of the problems described above, it is not always possible to apply the conventional white light emitting diodes in use applications for illumination, and the like. However, with this embodiment of the semiconductor light emitting apparatus 5, since the proportion of blue light emission is lower than with the conventional white light emitting diodes, the life time of the semiconductor light emitting apparatus 5 is capable of being kept long. Accordingly, this embodiment of the semiconductor light emitting apparatus 5 is advantageous also from the view point of the running cost.

(Examples of Design Modifications)

The present invention is not limited to the embodiments described above, and the device structures may be altered in various other ways.

EXAMPLES

The present invention will further be illustrated by the following non-limitative examples.

Example 1

The semiconductor layers 12 to 17, each of which was the AlGaInN layer or the GaInN layer, were formed on the ZnO base plate 11 by use of the film forming apparatus 100 illustrated in FIGS. 1A and 1B. In this manner, the semiconductor laser 1 acting as the first embodiment of the semiconductor light emitting device in accordance with the present invention was produced. The layer compositions and the layer thicknesses were set as described above for the aforesaid embodiment of the semiconductor laser 1.

An ArF excimer laser was used as the laser beam source 121, the output of the laser beam was set at 200 mJ, and the pulse period was set at 100 Hz. The laser beam having been radiated out from the laser beam source 121 was enlarged by the enlarging lens 122 and was then collimated by the collimator lens 123 into a collimated laser beam having a beam diameter of 2 inches. The laser beam L was thus irradiated to the base plate, such that the laser beam L might pass just above the base plate and in the direction parallel with the base plate surface. The irradiation of the laser beam L to the base plate was continued during the period of time from the beginning of the temperature rise of the base plate to the finish of the temperature fall of the base plate. The temperature of the base plate was set at 500° C.

As the Group-III raw materials, TMA/TEG/TMI were used. Also, as the Group-V raw material, ammonia was used. A hydrogen gas was introduced as a carrier gas into the reaction tube 110. As an n-type dopant source, $SiH_4$ (silane) was used. As a p-type dopant source, $Cp_2Mg$ (bicyclopentadienylmagnesium) was used. The pressure in the reaction tube 110 was set at 20 kPa.

After the p-type contact layer 17 was formed, the $SiO_2$ insulating film 20 was formed in a predetermined pattern. The p-type electrode 21 was then formed with vacuum evaporation processing and heat treatment. The base plate 11 was then polished until the entire thickness of the device became equal to approximately 100 μm. Thereafter, the n-type electrode 22 was formed with the vacuum evaporation processing and the heat treatment. In this manner, the semiconductor laser 1 was obtained.

The stripe width of the semiconductor laser 1 was set at 50 μm, and the resonator length was set at 500 μm. A dielectric multi-layer coating film having a reflectivity of 10% was formed on a front end face of the device. Also, a dielectric multi-layer coating film having a reflectivity of 90% was formed on a rear end face of the device.

The device having thus been obtained was mounted with a junction down technique on a copper heat sink of a mounting base plate. The obtained device exhibited an external quantum efficiency of 10% and thus had a high efficiency. The wavelength of the produced laser beam was 520 nm at the room temperature, and green light was obtained.

Example 2

The semiconductor layers 12 to 19, each of which was the AlGaInN layer or the GaInN layer, were formed on the ZnO base plate 11 in the same manner as that in Example 1. In this manner, the semiconductor laser 2 acting as the second embodiment of the semiconductor light emitting device in accordance with the present invention was produced. The layer compositions and the layer thicknesses were set as described above for the aforesaid embodiment of the semiconductor laser 2.

The resonator length was set at 300 μm. The stripe width of the semiconductor laser 2 corresponded to the width (=2 μm) of the ridge stripe section 16A. A dielectric multi-layer coating film having a reflectivity of 30% was formed on a front end face of the device. Also, a dielectric multi-layer coating film having a reflectivity of 60% was formed on a rear end face of the device.

The device having thus been obtained was mounted with a junction up technique on an iron heat sink of a mounting base plate. The wavelength of the produced laser beam was 600 nm at the room temperature, and yellow light was obtained.

Example 3

The semiconductor layers 12 to 17, each of which was the AlGaInN layer or the GaInN layer, were formed on the ZnO base plate 11 in the same manner as that in Example 1. In this manner, the light emitting diode 3 acting as the third embodiment of the semiconductor light emitting device in accordance with the present invention was produced. The layer compositions and the layer thicknesses were set as described above for the aforesaid embodiment of the light emitting diode 3.

The four GaInN quantum well layers 14A, 14A, 14A, 14A constituting the semiconductor active layer 14 had an identical composition and had different thicknesses. The transition wavelengths of the quantum well layers 14A, 14A, 14A, 14A were set at 440 nm/510 nm/580 nm/640 nm in this order from the side of the base plate.

The side of the p-type electrode 21 of the obtained device was mounted on an iron heat sink of a mounting base plate, such that the light might be taken out from the side of the n-type electrode 22. A light emitting diode, in which the white light was emitted directly from the semiconductor active layer 14, was obtained. The light emission efficiency of the obtained light emitting diode was equal to 1201 m/W. The light emission efficiency of the obtained light emitting diode was approximately three times as high as the light emission efficiency of the conventional white light emitting diode, in which the fluorescent substances are excited by the blue light emitting diode, in which the light having been produced by the blue light emitting diode and the light having been produced by the fluorescent substances are combined together, and in which the white light is thus obtained indirectly.

INDUSTRIAL APPLICABILITY

The techniques in accordance with the present invention are capable of being applied appropriately to semiconductor light emitting devices, such as semiconductor lasers and light emitting diodes.

What is claimed is:

1. A process for forming a semiconductor layer, comprising the steps of:
    forming a semiconductor layer on a base plate by use of a laser assisted metalorganic vapor phase epitaxy technique, the semiconductor layer containing, as a principal constituent, a Groups III-V semiconductor compound, which may be represented by the general formula:

$Al_xGa_yIn_zN$ wherein x represents a number satisfying the condition $0 \leq x < 1$, y represents a number satisfying the condition $0 < y < 1$, and z represents a number satisfying the condition $0 < z < 1$, with the proviso that $x+y+z=1$.

2. A process for forming a semiconductor layer as defined in claim 1 wherein a laser beam is irradiated to the base plate from at least one direction, such that the laser beam passes just above the base plate and in a direction approximately parallel with a base plate surface of the base plate, supply of film formation raw materials with respect to the base plate is performed, while the laser beam is being thus irradiated to the base plate, and the semiconductor layer is thereby formed.

3. A process for forming a semiconductor layer as defined in claim 2 wherein the irradiation of the laser beam to the base plate is performed with a laser beam profile, such that a distribution of a laser beam intensity, which distribution is taken in the direction parallel with the base plate surface, is approximately uniform, and such that the distribution of the laser beam intensity, which distribution is taken in the direction normal to the base plate surface, is the distribution approximately represented by the Gaussian distribution, and the laser beam is irradiated to the base plate, such that a peak of the distribution of the laser beam intensity, which distribution is taken in the direction normal to the base plate surface, is present within the range of at most 2 mm from the base plate surface, which range is taken in the direction normal to the base plate surface.

* * * * *